(12) United States Patent
Jeon (10) Patent No.: US 7,754,602 B2
(45) Date of Patent: Jul. 13, 2010

(54) SEMICONDUCTOR DEVICE AND METHOD FOR FABRICATING THE SAME

(75) Inventor: Haeng-Leem Jeon, Anyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/185,857

(22) Filed: Aug. 5, 2008

(65) Prior Publication Data

US 2009/0039511 A1 Feb. 12, 2009

(30) Foreign Application Priority Data

Aug. 10, 2007 (KR) ...................... 10-2007-0080571

(51) Int. Cl.
*H01L 21/4763* (2006.01)
(52) U.S. Cl. ...................... 438/637; 438/233; 438/597; 438/618
(58) Field of Classification Search .................. 438/233, 438/597, 618, 637
See application file for complete search history.

(56) References Cited

U.S. PATENT DOCUMENTS

| 6,010,935 | A  | * | 1/2000 | Doan .......................... 438/303 |
| 6,383,857 | B2 | * | 5/2002 | Terauchi et al. ............. 438/233 |
| 6,898,851 | B2 | * | 5/2005 | Nishioka et al. .............. 29/852 |
| 7,026,207 | B2 | * | 4/2006 | Tsai et al. .................... 438/233 |
| 7,501,331 | B2 | * | 3/2009 | Herner ........................ 438/486 |

\* cited by examiner

*Primary Examiner*—Zandra Smith
*Assistant Examiner*—Christy L Novacek
(74) *Attorney, Agent, or Firm*—Sherr & Vaughn, PLLC (57) ABSTRACT

A semiconductor device and a method for fabricating the same that includes a drain contact that can prevent bridging between contact metals in metal contact line (M1C) processes. The method includes forming a contact hole extending through an interlayer dielectric film in a space between respective gate electrodes to expose an undercut region, filling the contact hole and the undercut region with a photosensitive material, removing the photosensitive material from the contact hole and then forming a drain contact in the contact hole.

14 Claims, 9 Drawing Sheets

SEMICONDUCTOR DEVICE AND METHOD FOR FABRICATING THE SAME

The present application claims priority under 35 U.S.C. §119 to Korean Patent Application No. 10-2007-0080571 (filed on Aug. 10, 2007), which is hereby incorporated by reference in its entirety.

BACKGROUND

Semiconductor memory devices may be classified into volatile memory devices that lose information stored therein when not powered, and non-volatile memory devices that retain stored information even when not powered. In recent years, of the non-volatile memory devices, flash memories have been increasingly used.

Figure 1A:
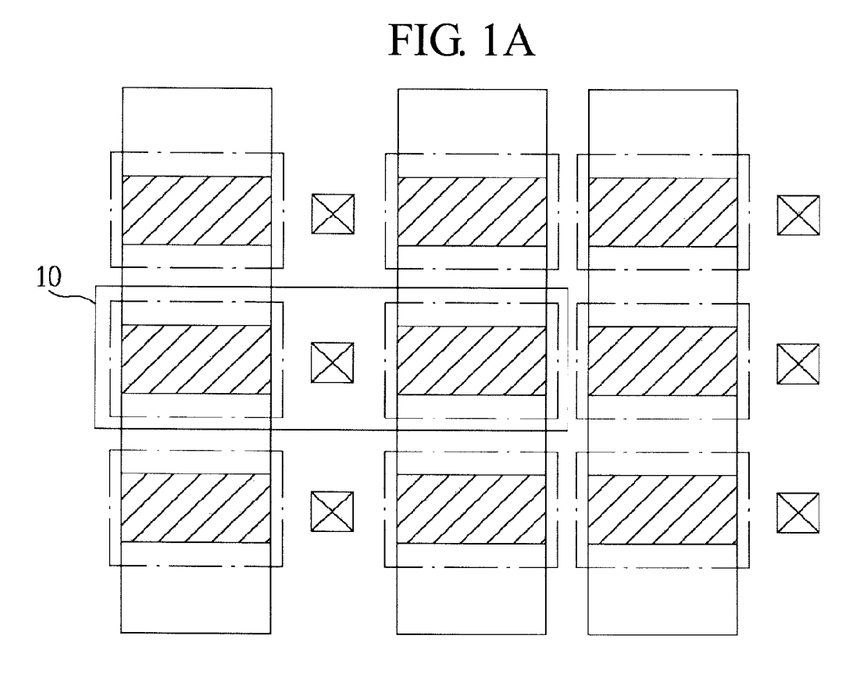
FIGS. 1A to 1C illustrate a flash memory cell.
Figure 1B:
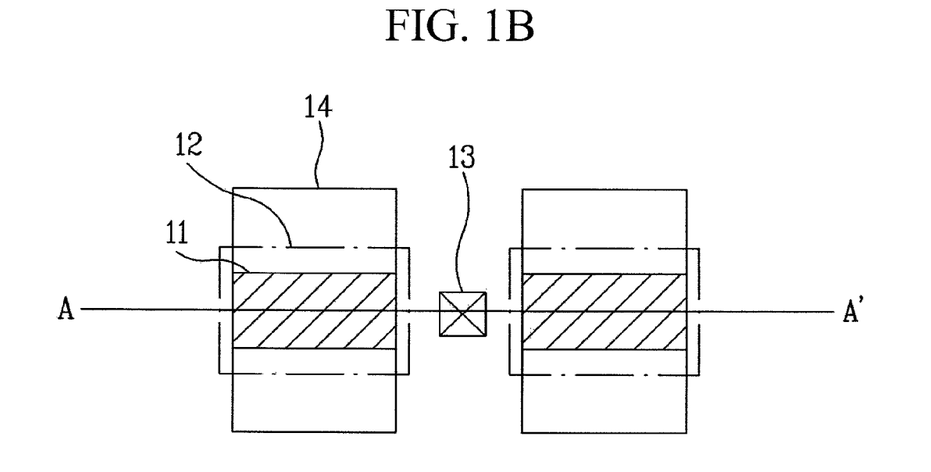
Figure 1C:
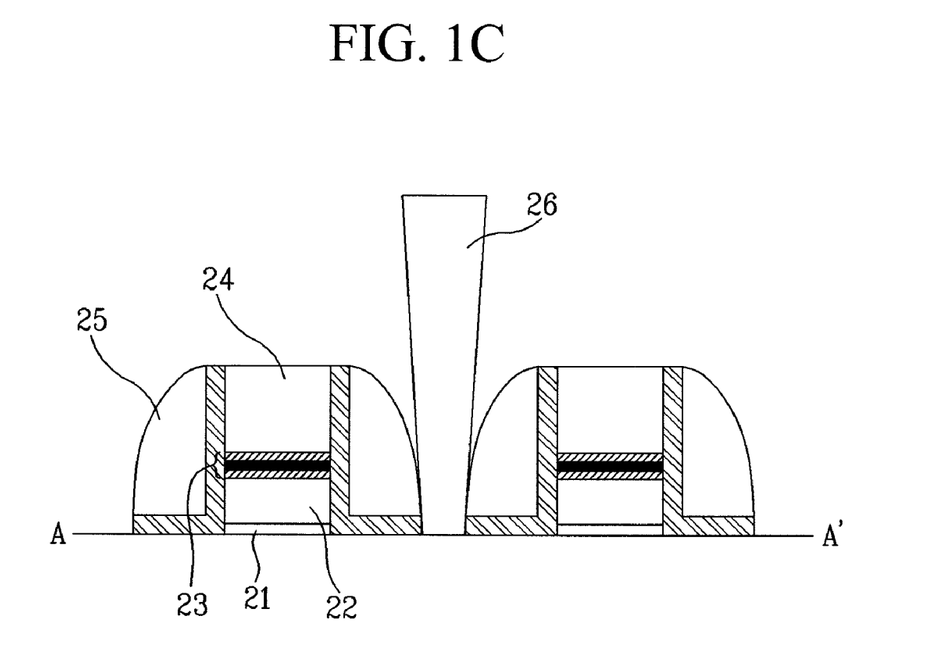

Example FIGS. 1A to 1C illustrate the structure of a flash memory cell. As illustrated in example FIG. 1A, the flash memory cell array has a string shape in which a plurality of memory cell units 10 are connected to each other in a row. Each memory cell unit 10 is connected to a word line and connected through a select transistor to a bit line. The bit line is connected to a drain through a contact hole formed on an insulating film.

As illustrated in example FIG. 1B, the flash memory cell unit 10 may include active area 11 where a channel is formed when a voltage is applied, floating gate 12 to store charges injected through tunneling, drain contact 13 serving as a bit line, and control gate 14 serving as a word line when the memory cell is erased or read.

As illustrated in example FIG. 1C, the flash memory cell unit includes tunneling oxide layer 21, floating gate 22, oxide/nitride/oxide (ONO) layer 23, control gate 24, spacer 25 having a double-layered structure composed of oxide and nitride layers, and drain contact 26.

The trend towards miniaturization and integration of semiconductor devices has brought about a decrease in word line pitch of flash memories and a decrease in the distance between gate electrode spacers.

Figure 2:
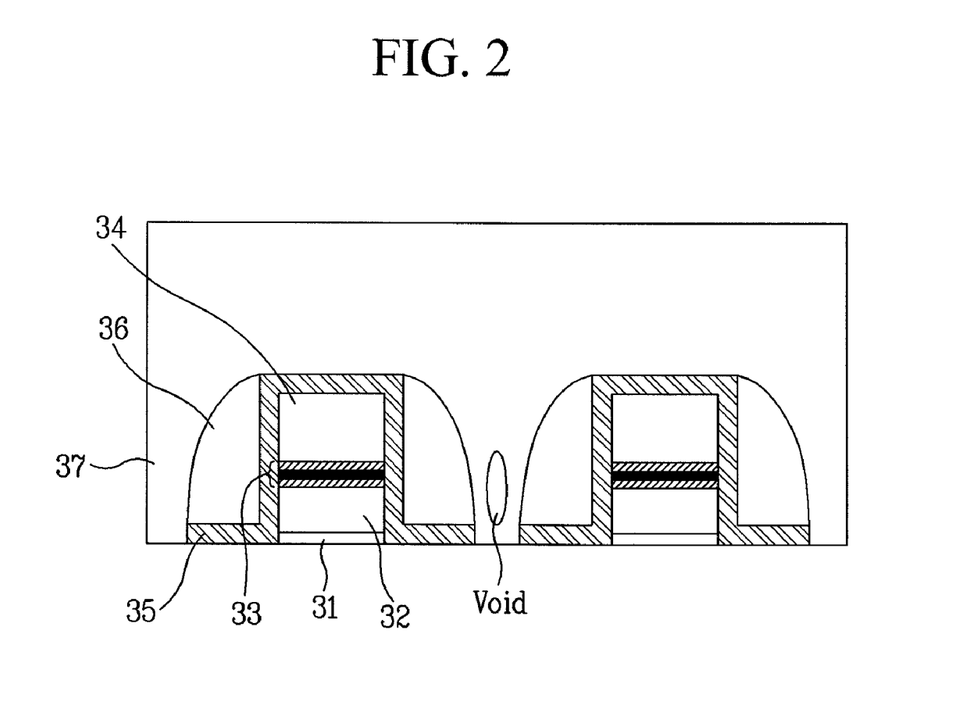
FIG. 2 illustrates a void created in a flash memory cell fabrication process.

Accordingly, as illustrated in example FIG. 2, the decrease in the space between gate electrodes disadvantageously causes voids in the process of depositing interlayer dielectric films. In addition, in an M1C (metal 1 contact) process, voids occur, which causes bridges between cells in contact metal gap-fill processes and thus malfunction of the cells.

Figure 3A:
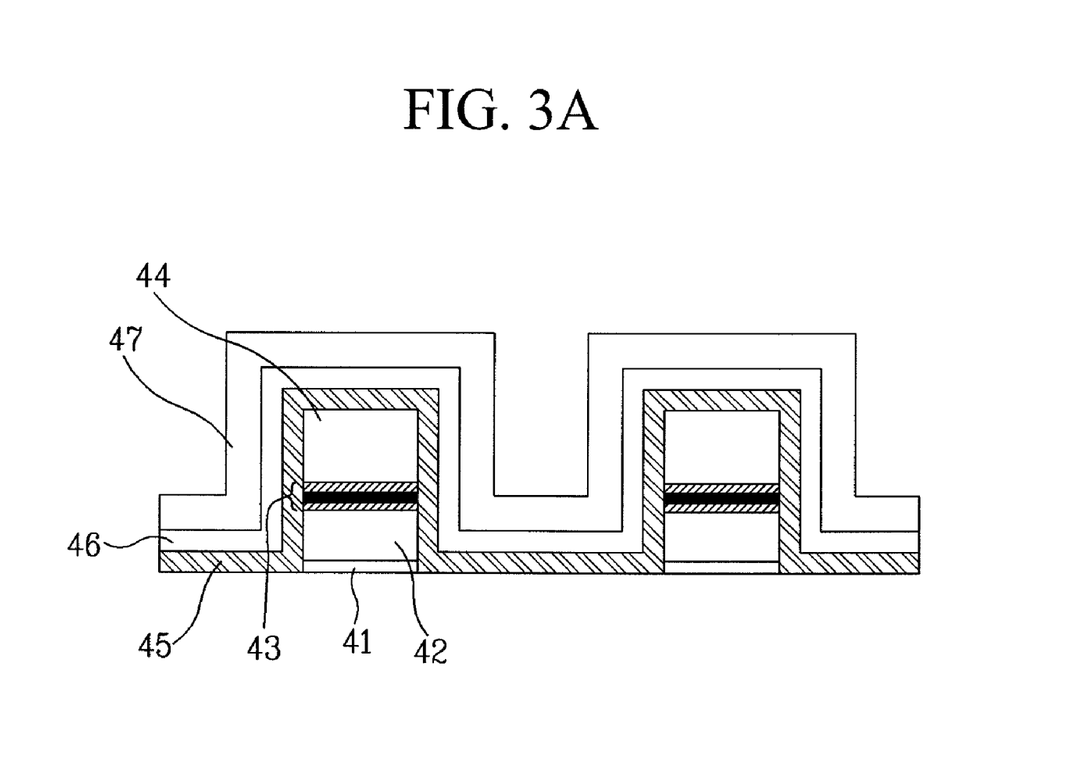
FIGS. 3A to 3C illustrate a method for fabricating a drain contact in a semiconductor device.
Figure 3B:
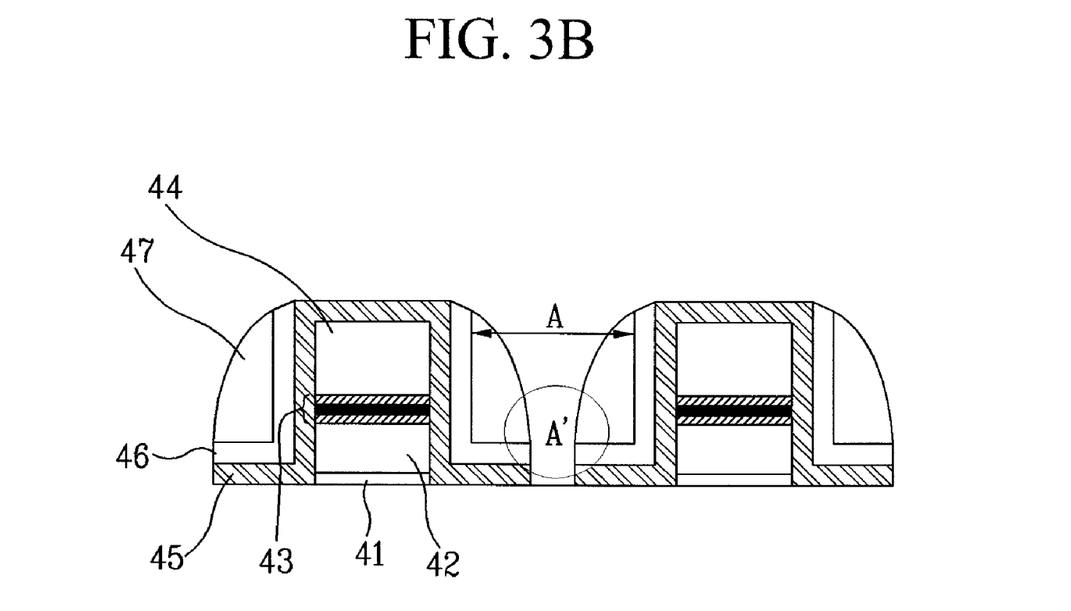
Figure 3C:
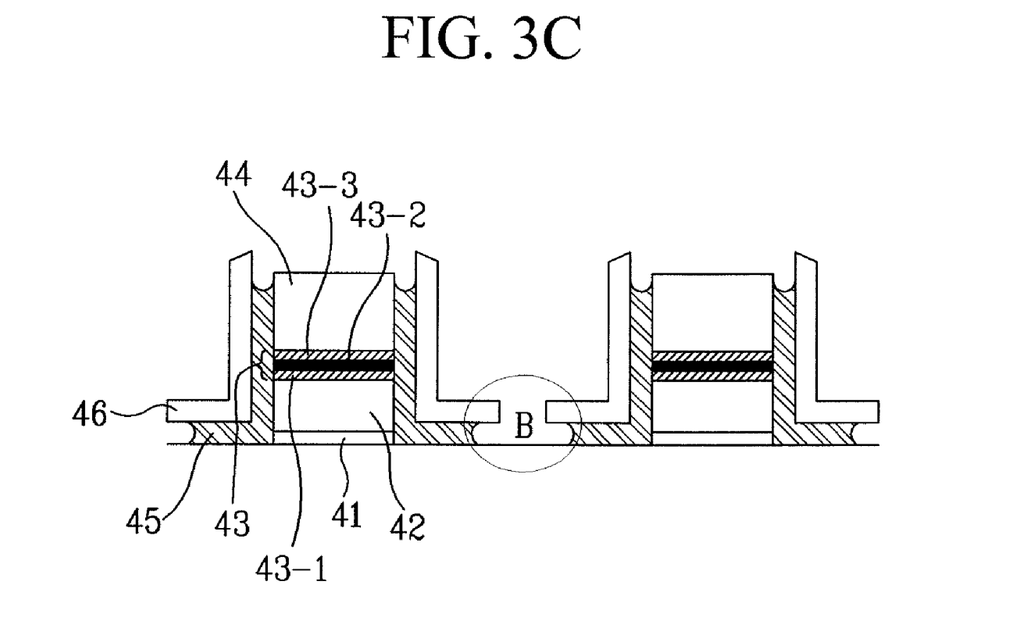

Accordingly, example FIGS. 3A to 3C illustrate a method for fabricating a semiconductor device to prevent formation of voids on an interlayer dielectric film.

As illustrated in example FIG. 3A, an ONO layer including first oxide film 45, nitride film 46 and second oxide film 47 are sequentially deposited on and/or over the entire surface of a substrate including a gate electrode provided with tunneling oxide film 41, floating gate 42, oxide/nitride/oxide (ONO) layer 43 and control gate 44.

As illustrated in example FIG. 3B, through a first etching process, first oxide film 45, nitride film 46 and second oxide film 47 are partially etched to form a spacer. The first etching is carried out via anisotropic dry etching. As a result, area A' where a drain contact is to be formed is provided in space A between adjacent gate electrodes.

As illustrated in example FIG. 3C, a secondary etching process is then performed until second oxide film 47 present on and/or over the outermost layer of the spacer is completely removed. The secondary etching is carried out via anisotropic wet etching using an etching material having a high etch selectivity for the oxide film in relation to the nitride film. As second oxide film 47 is completely removed, space B between the gate electrodes is then increased. Accordingly, in subsequent processes, upon gap-filling of interlayer dielectric films, no void is formed and gap-fill margin is thus improved.

However, during the secondary etching, as the wet etching proceeds, first oxide film 45 arranged under nitride film 46 is also etched, thus disadvantageously causing undercut B' to be formed. Furthermore, in metal contact line (M1C) processes, contact metal materials flow in the undercut B', thus disadvantageously resulting in bridges between the devices.

SUMMARY

Accordingly, embodiments are directed to a semiconductor device and a method for fabricating the same that includes a drain contact that prevents bridging between contact metals in metal contact line (M1C) processes in non-flash memory devices, and a method for fabricating the same.

Embodiments relate to a method for fabricating a semiconductor device that may include at least one of the following steps: sequentially depositing a first oxide film, a nitride film and a second oxide film on and/or over a substrate including a plurality of gate electrodes; and then subjecting the first oxide film, the nitride film and the second oxide film to first-etching to form a spacer on both side walls of each gate electrode; and then subjecting the second oxide film of the spacer to secondary-etching; and then forming an interlayer dielectric film on and/or over the entire surface of the substrate including the spacer; and then forming a contact hole in the space between the gate electrodes; and then embedding a photosensitive material in the contact hole; and then removing the photosensitive material; and then embedding a metal material into the contact hole.

Embodiments relate to a semiconductor device that may include at least one of the following: a first oxide film, a nitride film and a second oxide film sequentially deposited on and/or over a substrate including a plurality of gate electrodes; spacers arranged on both side walls of the gate electrode, wherein the spacers are formed by performing first etching of the first oxide film, the nitride film and the second oxide film, and then performing a second etching of the second oxide film; an interlayer dielectric film arranged on and/or over the entire surface of the substrate including the second oxide film-free spacer; a photosensitive material filled in a undercut where the first oxide film is partially etched by the secondary etching; and a metal material embedded in a contact hole present between the gate electrodes other than the undercut.

Embodiments relate to a method for fabricating a semiconductor device that may include at least one of the following steps: sequentially depositing a first oxide film, a nitride film and a second oxide film over a substrate including a plurality of gate electrodes; and then forming a spacer on sidewalls of the gate electrodes by performing a first etching process on the first oxide film, the nitride film and the second oxide film; and then subjecting the second oxide film to a second etching process; and then forming an interlayer dielectric film over the entire surface of the substrate including the spacers; and then forming a contact hole in a space between the gate electrodes; and then embedding a photosensitive material in the contact hole; and then removing a portion of the photosensitive material from the contact hole; and then embedding a metal material in the contact hole.

Embodiments relate to a method for fabricating a semiconductor device that may include at least one of the following steps: forming a plurality of gate electrodes spaced apart over a semiconductor substrate; and then sequentially forming a first oxide film, a nitride film and a second oxide film over the gate electrodes; and then forming a spacer on both side walls of each gate electrode by performing a first etching process on the first oxide film, the nitride film and the second oxide film; and then removing the second oxide film by performing and simultaneously forming an undercut region under the nitride film by performing a second etching process; and then forming an interlayer dielectric film over the substrate; and then forming a contact hole extending through the interlayer dielectric film in the space between the gate electrodes to expose the undercut region; and then filling the contact hole and the undercut region with a photosensitive material; and then removing the photosensitive material from the contact hole by performing a third etching process; and then forming a drain contact in the contact hole.

Embodiments relate to a semiconductor device that may include at least one of the following: a semiconductor substrate having a plurality of gate electrodes formed spaced apart thereon; a spacer formed on sidewalls of each gate electrode, the spacer including an oxide film and a nitride film; an interlayer dielectric film formed over the semiconductor substrate including the spacers; an undercut region formed under the nitride film; a contact hole extending through the interlayer dielectric film in the space between the gate electrodes and exposing the undercut region; a photosensitive material formed in the undercut region; and a drain contact filled in the contact hole.

The first oxide film and the second oxide film may be tetraethyl orthosilicate (TEOS). The first etching may be carried out through an anisotropic dry etching process and the secondary etching may be carried out through an anisotropic wet etching process. The secondary etching may be carried out using an etching material having a high etching selectivity for the oxide film in relation to the nitride film. The interlayer dielectric film may be a pre-metal dielectric (PMD) film. The PMD may include at least one of undoped silicate glass (USG), borophosphosilicate glass (BPSG), fluorine-doped silicon oxide (FSG), phosphosilicate glass (PSG) and borosilicate glass (BSG). The photosensitive material may be an epoxy or thermosetting resin that includes novolac. The photosensitive material may be removed through an ashing process with addition of a solvent. The metal material may be selected from a group including tungsten (W), aluminium (Al) and copper (Cu).

DRAWINGS

Example

Example

Example

Example

DESCRIPTION

Hereinafter, configurations and functions of preferred embodiments of the present invention will be illustrated with reference to the annexed drawings. Although the configurations and functions of the present invention are illustrated in the accompanying example drawing figures, in conjunction with at least one embodiment, and are described with reference to the accompanying drawings and the embodiment, the technical idea thereof and the important configurations and functions thereof are not limited thereto.

Figure 4A:
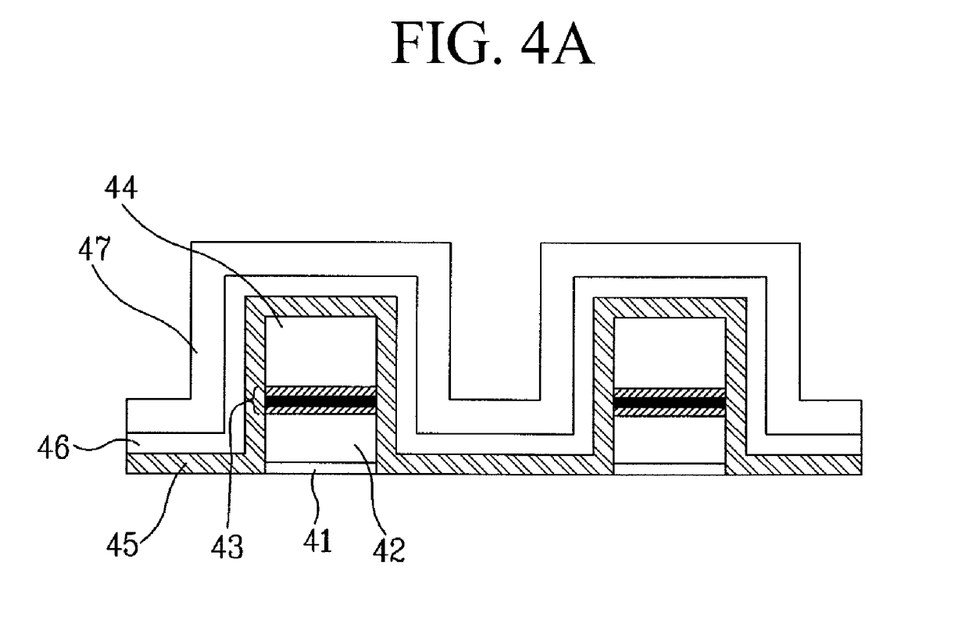
FIGS. 4A to 4H illustrate a method for forming a drain contact of a semiconductor device in accordance with embodiments.

As illustrated in example FIG. 4A, tunneling oxide film 41, floating gate 42, ONO film 43 and control gate 44 are laminated on and/or over a semiconductor substrate to form gate electrodes spaced apart on the substrate. Floating gate 42 may be formed of doped-polysilicon. ONO film 43 functions to retain charges stored in floating gate 42, and has a laminated structure including lower oxide film 43-1, nitride film 43-2 and upper oxide film 43-3 arranged in this order. Control gate 44 is a layer, to which a voltage is applied, that permits electrons present in floating gate 42 to be moved to the semiconductor substrate. In order to reduce electrical resistance, control gate 44 may have a polycide structure in which polysilicon is laminated over metal silicide.

Figure 4B:
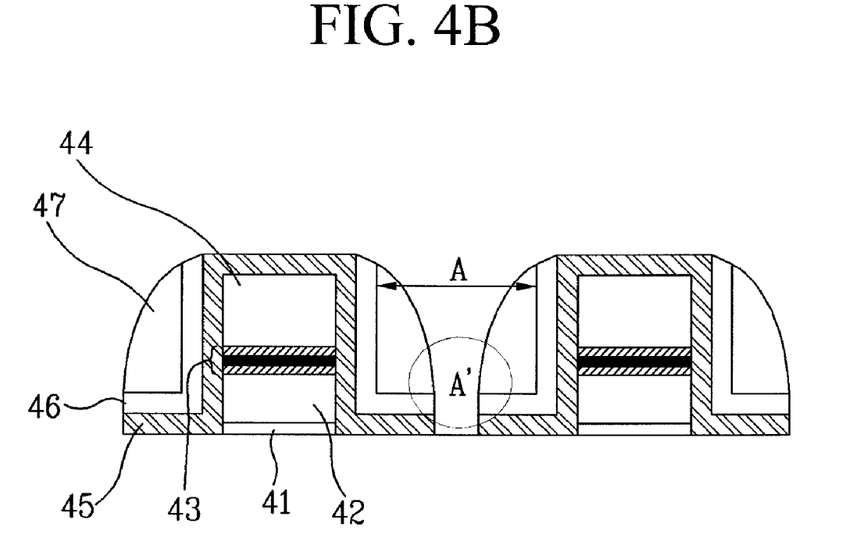

As illustrated in example FIG. 4B, a first etching process is performed to form spacers on and/or over both side walls of each gate electrode. The first etching is carried out via dry-etching. The first etching enables the deposited ONO film to be partially etched, thus allows for formation of the spacers. Then, micro source/drain implantation is performed using the spacers as masks. After the implantation, the spacer profile may be varied or not.

Figure 4C:
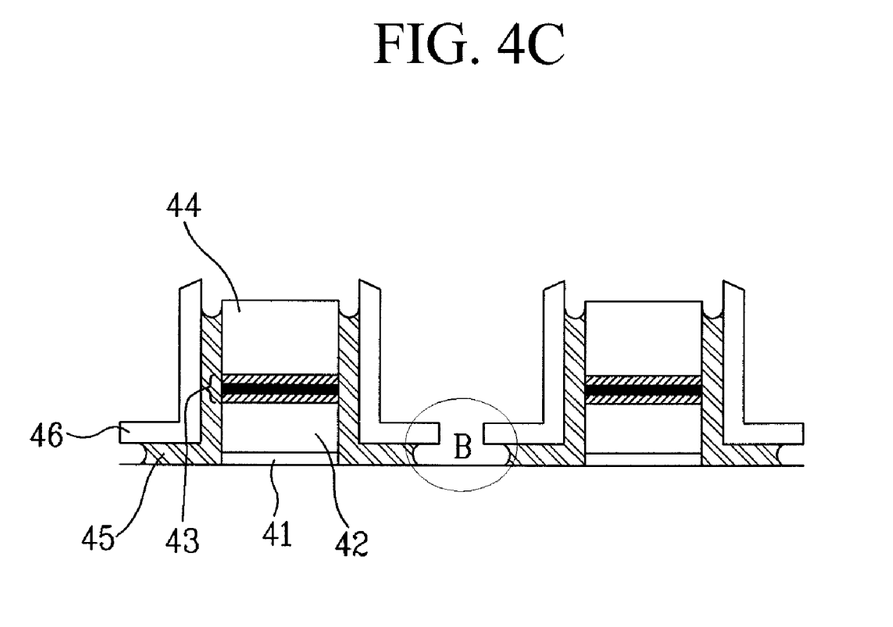

As illustrated in example FIG. 4C, a second etching process is then performed until second oxide film 47 is entirely removed. The second etching is carried out by wet etching, which uses an etching material having an etch selectivity for the oxide film in relation to the nitride film. As a result of the second etching, only first oxide film 45 and nitride film 46 among the spacer components remain. Due to the removal of second oxide film 47, the spatial distance B between the spacers of the gate electrodes is increased.

Figure 4D:
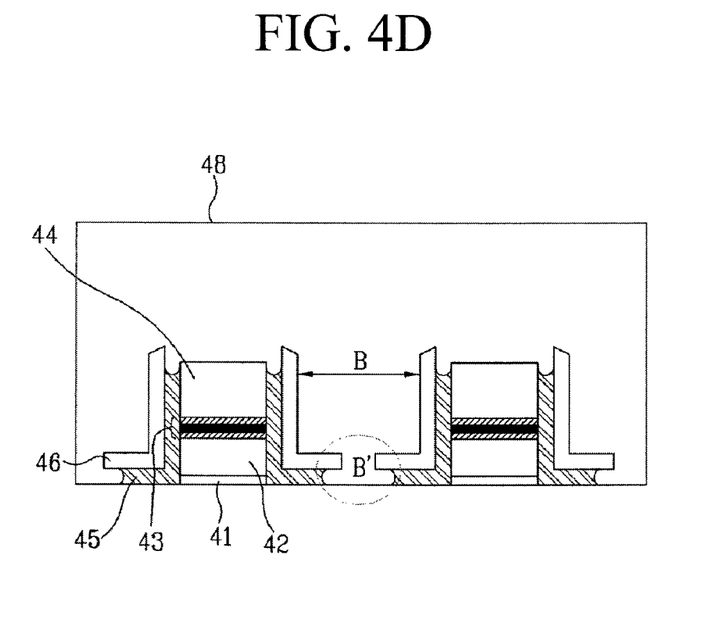

As illustrated in example FIG. 4D, interlayer dielectric film 48 is then deposited on and/or over the substrate. Interlayer dielectric film 48 is an insulating film to separate the gate electrode made of polysilicon from the metal line. Interlayer dielectric film 48 exhibits gap-fill capability and superior gathering performance, i.e., the ability to trap metal ions, may be easily planarized, and be formed of a low-hygroscopic pre-metal dielectric (hereinafter, referred to as "PMD") film such as undoped silicate glass (USG), borophosphosilicate glass (BPSG), fluorine-doped silicon oxide (FSG), phosphosilicate glass (PSG), borosilicate glass (BSG) and the like.

Figure 4E:
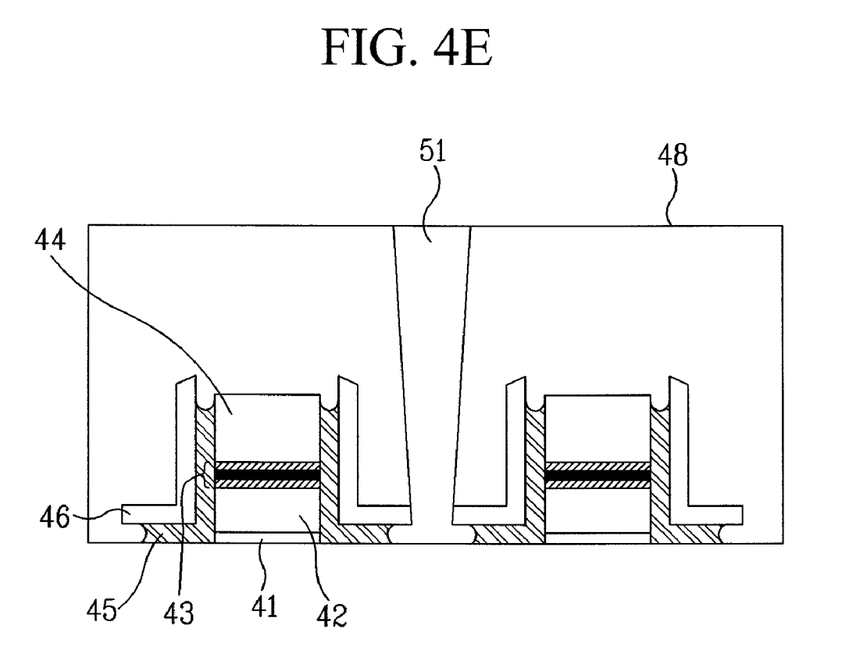

As illustrated in example FIG. 4E, contact hole 51 for the drain contact is formed in interlayer dielectric film 48 in the space between the gate electrode spacers. The formation of contact hole 51 is carried out though a third etching process. The third etching process is performed using a material having a high etch selectivity to the interlayer dielectric film. As a result, the undercut present under spacer nitride film 46 is completely exposed.

Figure 4F:
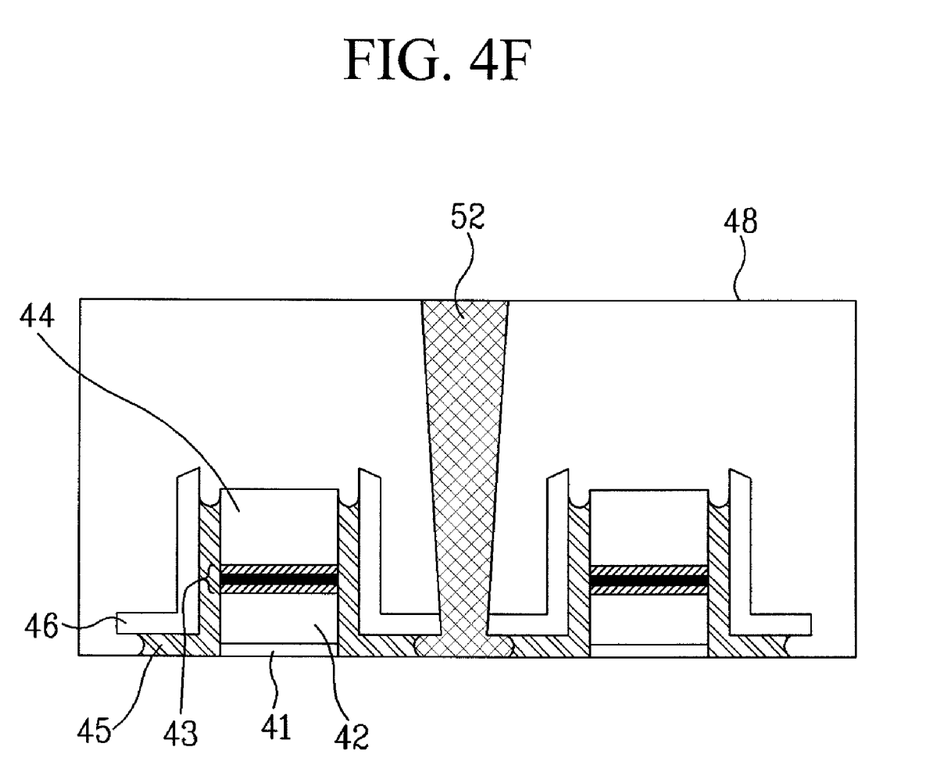

As illustrated in example FIG. 4F, contact hole 51 is gap-filled with photosensitive material 52. Photosensitive material 52 may be an epoxy or thermosetting resin that includes novolac. At this time, the undercut is also completely gap-filled.

Figure 4G:
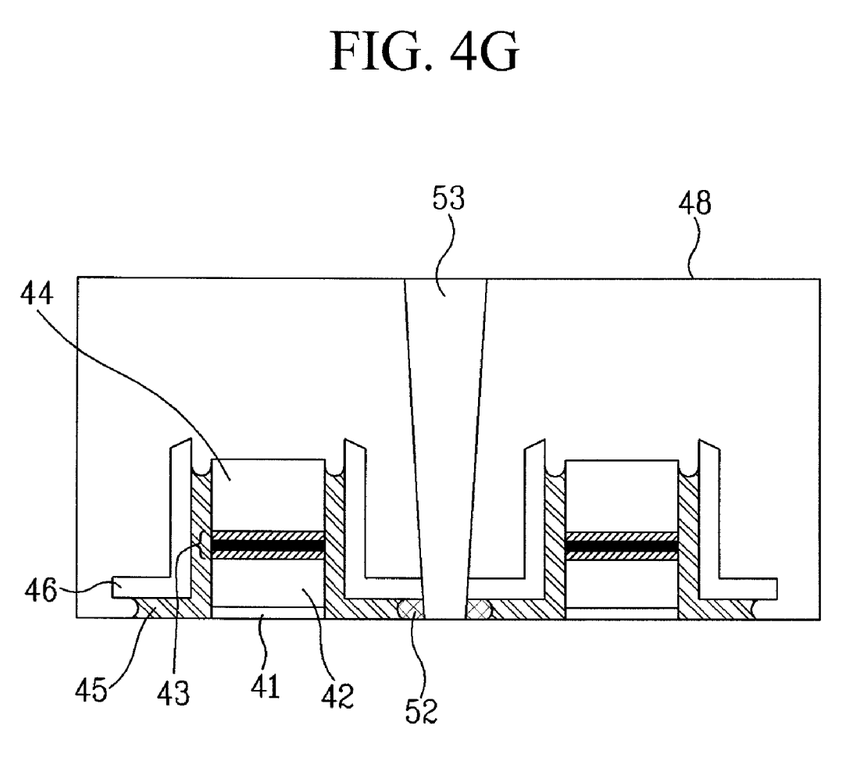

As illustrated in example FIG. 4G, a portion of photosensitive material 52 is removed. The removal of photosensitive material 52 is carried out through an ashing process with addition of a solvent. However, even after the ashing process is completed, photosensitive material 52 remains in an undercut region, i.e., a space under spacer nitride film 46.

Figure 4H:
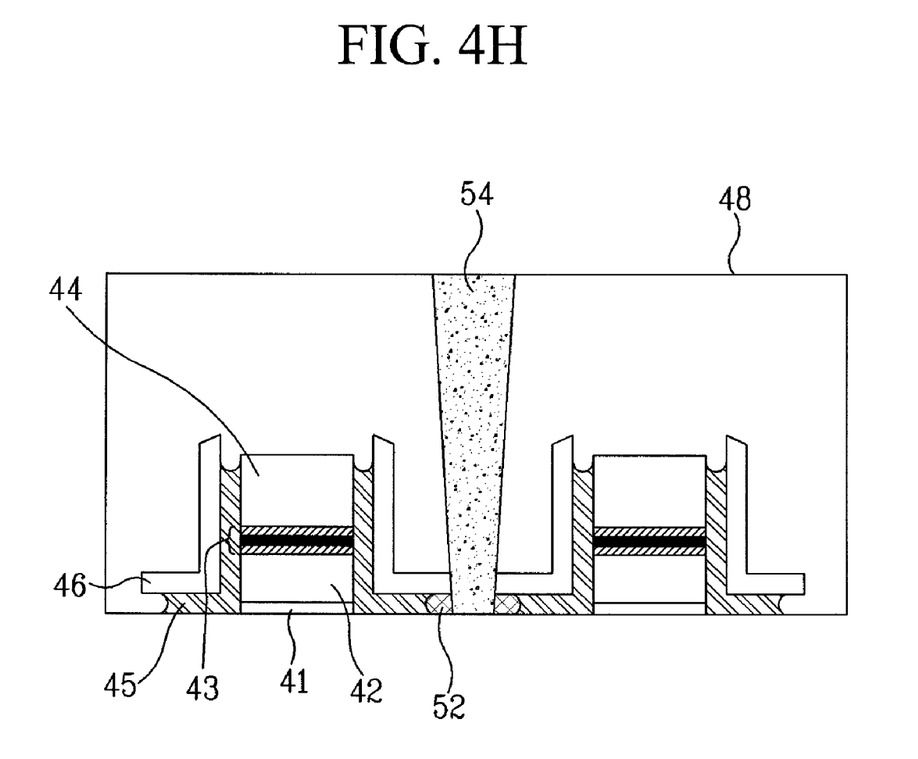

As illustrated in example FIG. 4H, contact hole 53 is gap-filled with a metal material to form a drain contact. Metal material 54 is selected from a group including tungsten (W), aluminium (Al) and copper (Cu). Accordingly, photosensitive material 52 that remains in the undercut region prevents occurrence of a bridge which is typically caused by flow of the metal material into the undercut.

Accordingly, the semiconductor device fabricated by the method in accordance with embodiments includes gate electrodes having tunneling oxide film 41, floating gate 42, ONO film 43 and control gate 44 laminated on and/or over the semiconductor substrate. Spacer including first oxide film 45 and nitride film 46 are provided on and/or over both side walls of each gate electrode. Interlayer dielectric film 48 may be arranged on and/or over the entire surface of the substrate including the spacer. Photosensitive material 52 is provided in an undercut region where first oxide film 45 is partially etched, and a metal material 54 is embedded in contact hole 53 provided between the gate electrodes other than the undercut region.

As apparent from the afore-going, the semiconductor device and the method for fabricating the same are advantageous in that in metal contact line (M1C) processes of non-volatile memory devices, the bridge between contact metals can be prevented and semiconductor yield can thus be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method comprising:
    sequentially depositing a first oxide film, a nitride film and a second oxide film over a substrate including a plurality of gate electrodes; and then
    forming a spacer on sidewalls of the gate electrodes by performing a first etching process on the first oxide film, the nitride film and the second oxide film; and then
    subjecting the second oxide film to a second etching process; and then
    forming an interlayer dielectric film over the entire surface of the substrate including the spacers; and then
    forming a contact hole in a space between the gate electrodes; and then
    embedding a photosensitive material in the contact hole; and then
    removing a portion of the photosensitive material from the contact hole; and then
    embedding a metal material in the contact hole,
    wherein the second etching process comprises forming an undercut region in the space between the gate electrodes, wherein removing the portion of the photosensitive material comprises leaving a portion of the photosensitive material in the undercut region.

2. The method of claim 1, wherein the first oxide film and the second oxide film comprise tetraethyl orthosilicate (TEOS).

3. The method of claim 1, wherein the first etching process is carried out through an anisotropic dry etching process.

4. The method of claim 1, wherein the second etching process is carried out through an anisotropic wet etching process.

5. The method of claim 1, wherein the second etching process is carried out using an etching material having a high etching selectivity for the second oxide film in relation to the nitride film.

6. The method of claim 1, wherein the interlayer dielectric film comprises a pre-metal dielectric (PMD) film.

7. The method of claim 6, wherein the PMD comprises at least one of undoped-silicate glass (USG), borophosphosilicate glass (BPSG), fluorine-doped silicon oxide (FSG), phosphosilicate glass (PSG) and borosilicate glass (BSG).

8. The method of claim 1, wherein the photosensitive material comprises at least one of an epoxy and a thermosetting resin.

9. The method of claim 8, wherein the thermosetting resin comprise novolac.

10. The method of claim 1, wherein the photosensitive material is removed through an ashing process with addition of a solvent.

11. The method of claim 1, wherein the metal material comprises at least one of tungsten (W), aluminium (Al) and copper (Cu).

12. A method for fabricating a semiconductor device comprising:
    forming a plurality of gate electrodes spaced apart over a semiconductor substrate; and then
    sequentially forming a first oxide film, a nitride film and a second oxide film over the gate electrodes; and then
    forming a spacer on both side walls of each gate electrode by performing a first etching process on the first oxide film, the nitride film and the second oxide film; and then
    removing the second oxide film by performing and simultaneously forming an undercut region under the nitride film by performing a second etching process; and then
    forming an interlayer dielectric film over the substrate; and then
    forming a contact hole extending through the interlayer dielectric film in the space between the gate electrodes to expose the undercut region; and then
    filling the contact hole and the undercut region with a photosensitive material; and then
    removing the photosensitive material from the contact hole by performing a third etching process, wherein said removing the photosensitive material from the contact hole comprises leaving a portion of the photosensitive material in the undercut region; and then
    forming a drain contact in the contact hole.

13. A method for fabricating a semiconductor device comprising:
    forming a plurality of gate electrodes over a semiconductor substrate;
    forming a spacer on sidewalls of each of the plurality of gate electrodes;
    removing a portion of the spacer, wherein said removing a portion of the spacer creates an undercut region under the spacer;
    forming a dielectric film over the substrate;
    forming a contact hole in the interlayer dielectric film, wherein the contact hole exposes the undercut region;
    filling the undercut region with a photosensitive material; and
    forming a contact in the contact hole.

14. The method of claim 13, wherein said filling the undercut region comprises:
    filling the contact hole and the undercut region with the photosensitive material; and
    removing the photosensitive material from the contact hole while leaving a portion of the photosensitive material in the undercut region.

* * * * *